United States Patent [19]
Wada et al.

[11] Patent Number: 5,079,443
[45] Date of Patent: Jan. 7, 1992

[54] VOLTAGE COMPARATOR CIRCUIT HAVING HYSTERESIS CHARACTERISTICS OF NARROW RANGE OF VOLTAGE

[75] Inventors: Yoshio Wada; Katsuji Fujita, both of Yokohama, Japan

[73] Assignee: Kabushiki Kaisha Toshiba, Kawasaki, Japan

[21] Appl. No.: 586,987

[22] Filed: Sep. 24, 1990

[30] Foreign Application Priority Data

Sep. 27, 1989 [JP] Japan .................................. 1-249077

[51] Int. Cl.⁵ .......................... H03K 5/153; H03K 5/22
[52] U.S. Cl. ..................................... 307/362; 307/355; 307/530; 307/360; 307/291
[58] Field of Search ............... 307/355, 530, 360, 291, 307/362, 244, 354, 359, 356, 357, 363, 364

[56] References Cited
U.S. PATENT DOCUMENTS 4,506,170 3/1985 Mizuide ............................. 307/355

Primary Examiner—Eugene R. LaRoche
Assistant Examiner—Ali Neyzari
Attorney, Agent, or Firm—Finnegan, Henderson, Farabow, Garrett and Dunner

[57] ABSTRACT

Since the resistor is inserted between each of the emitters of the transistors to which the comparison voltage is applied and each of the collectors of the differential pair of transistors, a positive feedback is applied at different points where a differential input voltage is increased from the negative and it is decreased from the positive, and thus the voltage comparator circuit has the hysteresis characteristics. It is therefore possible to reliably have the hysteresis characteristics of a narrow range of voltage of 100 mV or less (for example, several tens of millivolts) without increasing the number of elements in use or depending upon the value of k·T/q (k is the Boltzmann's constant, T is an absolute temperature, and q is an amount of charge of electrons).

16 Claims, 8 Drawing Sheets

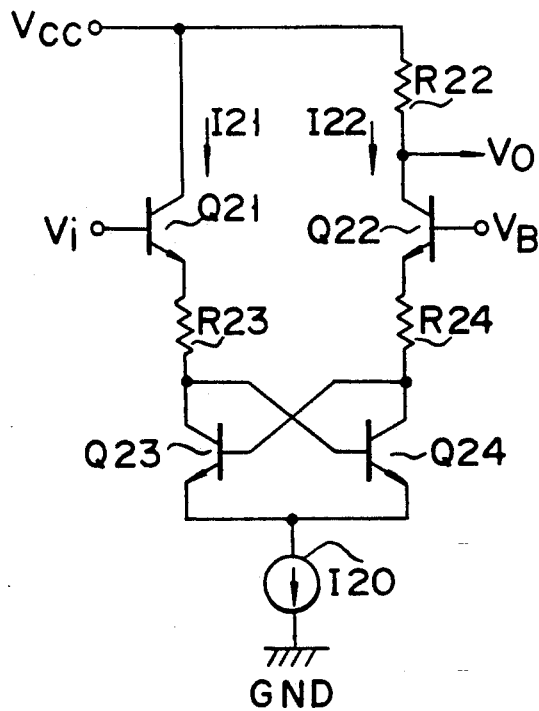
F I G. 2

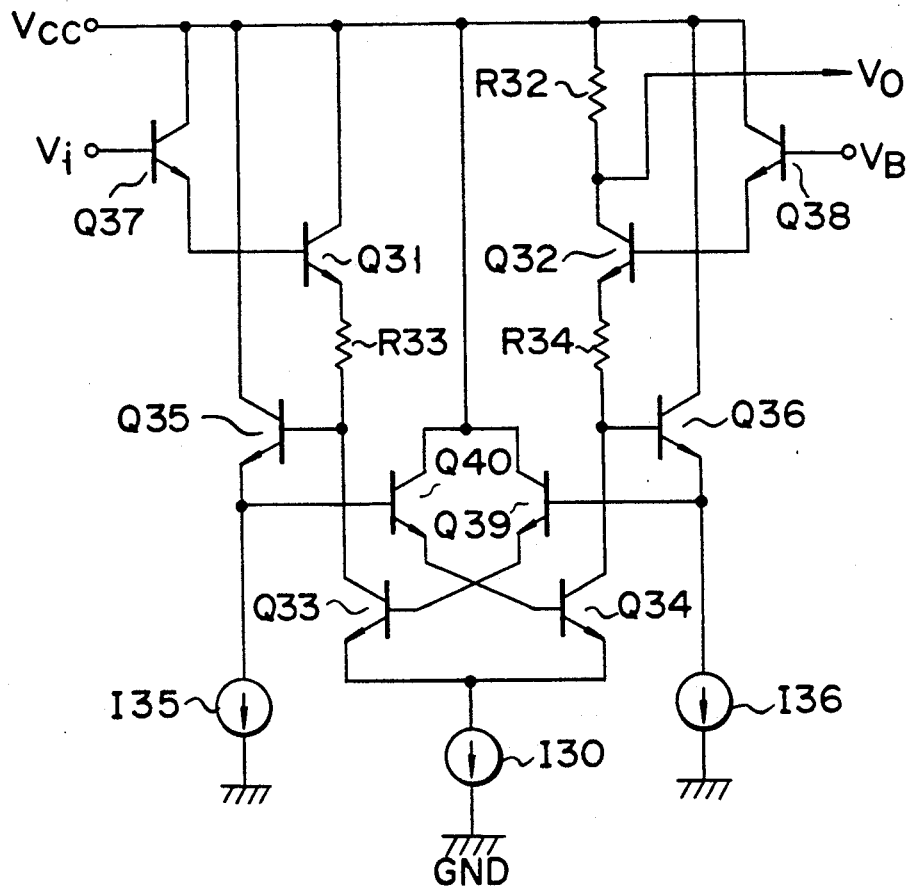
F I G. 7

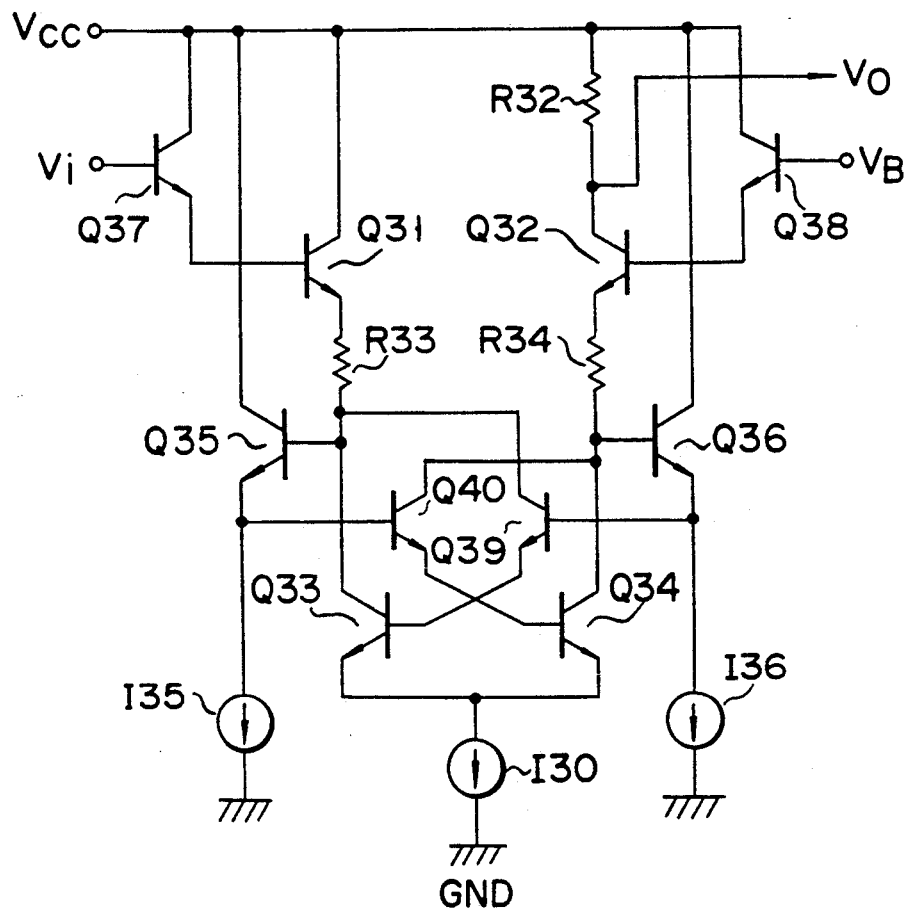
F I G. 8

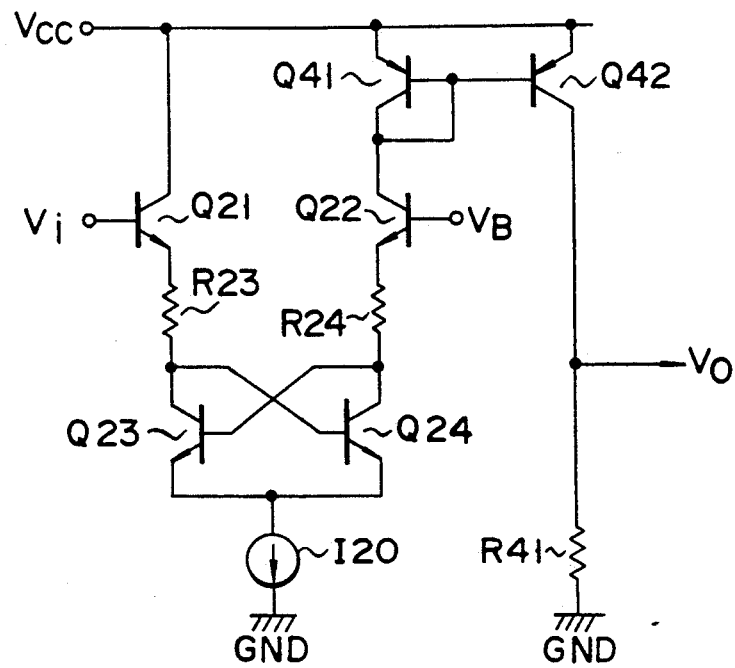
F I G. 9
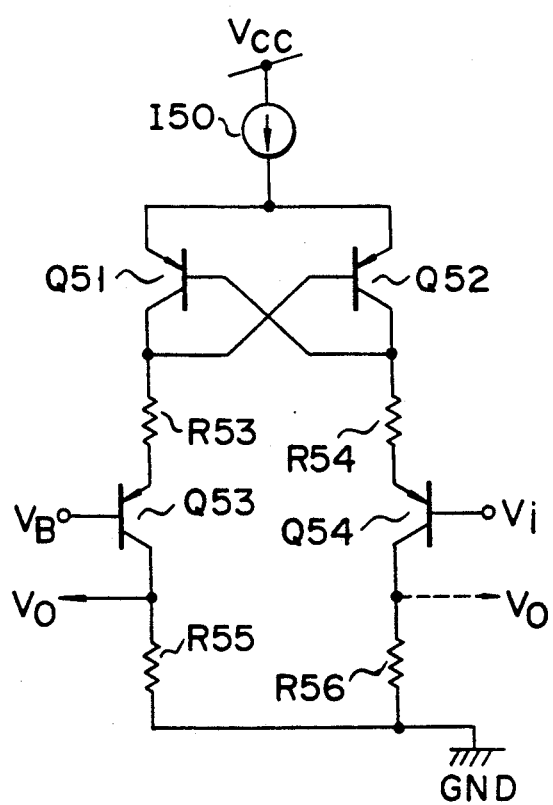
F I G. 10

VOLTAGE COMPARATOR CIRCUIT HAVING HYSTERESIS CHARACTERISTICS OF NARROW RANGE OF VOLTAGE

BACKGROUND OF THE INVENTION

1. Field of the Invention

The present invention relates to a voltage comparator circuit which is used when an analog signal is converted into a digital signal in a semiconductor integrated circuit and, more particularly, to a voltage comparator circuit having hysteresis characteristics of a narrow range of voltage and using a high gain differential amplifier.

2. Description of the Related Art

FIG. 1 illustrates the arrangement of a conventional voltage comparator circuit. This circuit comprises a differential pair of NPN transistors Q11 and Q12 to which a reference voltage is applied, whose emitters are connected to each other, constant current source I10 connected between a connecting point of the emitters of transistors Q11 and Q12 and ground GND first resistor R11 connected between the collector of transistor Q11 and power source Vcc, PNP transistor Q13 whose emitter and collector are connected between power source Vcc and the collector of transistor Q12 and whose base and collector are connected to each other, PNP transistor Q14 which is connected to transistor Q13 to form a current mirror circuit and whose collector is connected to the base of transistor Q12, and second resistor R12 connected to the base of transistor Q12.

Reference voltage $V_B$ (threshold voltage) is applied to one end of second resistor R12, and comparison voltage Vi is applied to the base of transistor Q11. Comparison voltage Vo is output from the collector of transistor Q11.

The conventional voltage comparator circuit is caused to have hysteresis characteristics by applying a positive feedback to transistor Q12 from transistors Q13 and Q14. However, the hysteresis characteristics cannot be obtained unless the gain of the feedback is one or more. The gain is given as follows.

$$q \cdot I10 \cdot R12/4 \cdot k \cdot T \qquad (1)$$

The following is therefore the condition that the gain is one or more.

$$R12 > 4 \cdot k \cdot T/q \cdot I10 \qquad (2)$$

where k is the Boltzmann's constant, q is an amount of charge of electrons, and T is an absolute temperature.

It turns out from the above conditions that the hysteresis characteristics depend on $k \cdot T/q$ and thus have temperature dependency.

Since the voltage applying linearity of transistors Q11 and Q12 is poor and, in other words, a dynamic range is narrow, it is difficult to correlate R12 (or R12 I10) with a range of hysteresis.

As described above, the conventional voltage comparator circuit has a drawback in which it is virtually impossible to cause the circuit to reliably have the hysteresis characteristics of a narrow range of voltage.

SUMMARY OF THE INVENTION

It is accordingly an object of the present invention to provide a voltage comparator circuit capable of easily and reliably having hysteresis characteristics of a narrow range of voltage of 100 mV or less (e.g., several tens of millivolts).

According to this invention, there is provided a voltage comparator circuit comprising:

a first transistor to a base of which a comparison voltage is applied and whose collector is connected to a first power source;

a second transistor to a base of which a reference voltage is applied and whose collector is connected to the first power source;

a differential pair of third and fourth transistors whose emitters are connected to each other and whose bases and collectors are connected to each other, two lines connecting the bases and collectors of said third and fourth transistors crossing each other;

a first constant current source connected between a connecting point of the emitters of said third and fourth transistors and a second power source;

a third resistor connected between the emitter of said first transistor and the collector of said third transistor; and a fourth resistor connected between the emitter of said second transistor and the collector of said fourth transistor.

In the above-described arrangement of the voltage comparator circuit, the first to fourth transistors constitute a high gain differential amplifier. Since the resistor is inserted between each of the emitters of the transistors to which the comparison voltage is applied and each of the collectors of the differential pair of transistors, a positive feedback is applied at different points where a differential input voltage is increased from the negative and it is decreased from the positive, and thus the voltage comparator circuit has the hysteresis characteristics. It is therefore possible to reliably have the hysteresis characteristics of a narrow range of voltage of 100 mV or less (for example, several tens of millivolts) without increasing the number of elements in use or depending upon the value of $k \cdot T/q$ (k is the Boltzmann's constant, T is an absolute temperature, and q is an amount of charge of electrons).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a voltage comparator circuit according to a first embodiment of the present invention;

FIG. 7 is a circuit diagram showing a voltage comparator circuit according to a third embodiment of the present invention;

FIG. 8 is a circuit diagram showing a modification example of the circuit shown in FIG. 7;

FIG. 9 is a circuit diagram showing an application example of the circuit shown in FIG. 2;

FIG. 10 is a circuit diagram showing an application example of the circuit arrangement shown in FIG. 2;

DETAILED DESCRIPTION OF THE PREFERRED EMBODIMENTS

An embodiment of the present invention will be described with reference to the accompanying drawings.

FIG. 2 illustrates a voltage comparator circuit which is formed in a semiconductor integrated circuit. In FIG. 2, Q21 and Q22 denote NPN transistors. Comparison voltage Vi is applied to the base of transistor Q21, and reference voltage V B (threshold voltage) is applied to the base of transistor Q22.

The collector of transistor Q21 is connected to first power source Vcc, and resistor R2 is connected between the collector of transistor Q22 and power source Vcc.

Transistors Q23 and Q24 constitute a differential pair of NPN transistors. The emitters of transistors Q23 and Q24 are connected to each other. The collector and base of transistor Q23 are connected to the base and collector of transistor Q24, respectively, so that two lines connecting the bases and collectors of transistors Q23 and Q24 cross each other. Constant current source I20 is connected between a connecting point of the emitters of transistors Q23 and Q24 and a second power source (ground GND). The emitter of transistor Q21 is connected to the collector of transistor Q23 through resistor R23, and the emitter of transistor Q22 is connected to the collector of transistor Q24 through resistor R24. Comparison voltage Vo is output from the collector of transistor Q22.

Figure 3:
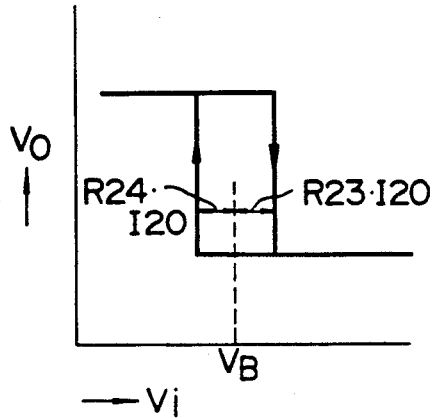
FIG. 3 is a characteristic diagram for explaining an operation of the circuit shown in FIG. 2.

The operation of the voltage comparator circuit will be described with reference to FIG. 3. It is well-known that transistors Q21 to Q24 theoretically constitute a high gain differential amplifier whose gain is infinite. In the high gain differential amplifier, as shown, resistor R23 is inserted between the emitter of transistor Q21 and the collector of transistor Q23, and resistor R24 is inserted between the emitter of transistor Q22 and the collector of transistor Q24. The I/O characteristics is thus illustrated in FIG. 3.

Assuming that the currents flowing into transistors Q21 and Q22 are represented by I21 and I22, when Vi >>V$_B$, I22 =I20. The I/O characteristics of current I22 are expressed by the following equation and shown in FIG. 4.

$$I22 = \{i20 \cdot R23/(R23 + R24)\} + \{(V_B - Vi)/R23 + R24)\} \quad (3)$$

Figure 4:
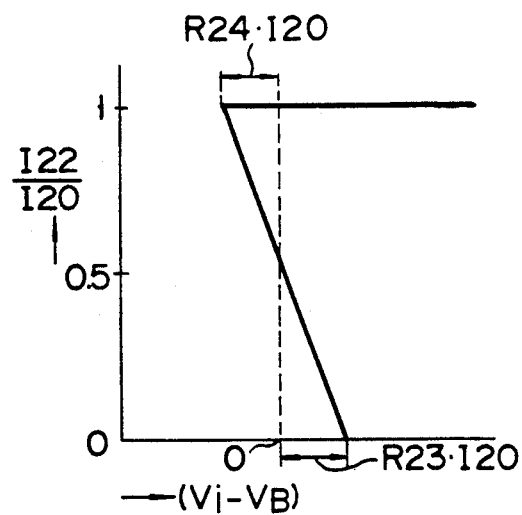
FIG. 4 is a characteristic diagram showing the I/O characteristics of input voltage Vi and current I10 flowing into transistor Q12 in the circuit shown in FIG. 2.

As is understood from FIG. 4, when (Vi −V$_B$) increases from the negative, the gain of positive feedback is one or more at a point of R23 · I20 and the circuit presents negative resistance. In other words, if the gain of the circuit becomes negative and the voltage drops, the amount of current becomes large and theoretically the line inclines in the negative direction. When (Vi −V$_B$) decreases from the positive, theoretically, the circuit presents negative resistance at a point of −R24 · I20 in the line which inclines in the negative direction. The positive feedback is thus applied at these points and a value of I22/I20 greatly changes from 0 to 1 or from 1 to 0. The voltage comparator circuit therefore has hysteresis characteristics.

The voltage comparator circuit according to the above embodiment can easily and reliably have the hysteresis characteristics of a narrow range of voltage of 100 mV or less (for example, several tens of millivolts) without increasing the number of elements in use or depending upon the value of k ·T/q (k is the Boltzmann's constant, T is an absolute temperature, and q is an amount of charge of electrons).

Figure 5A:
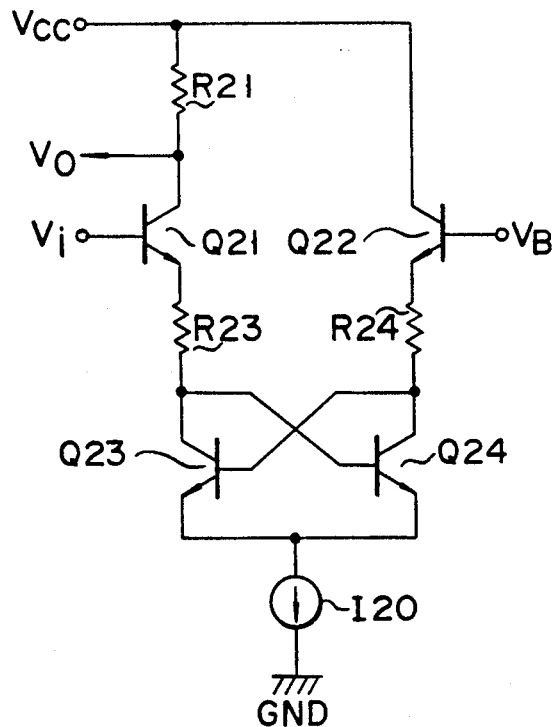
FIG. 5A is a circuit diagram showing a first modification example of the circuit shown in FIG. 2.
Figure 5B:
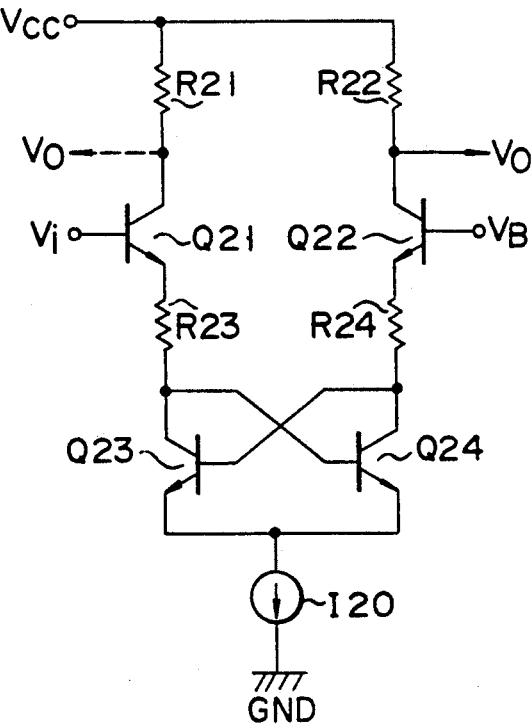
FIG. 5B is a circuit diagram showing a second modification example of the circuit shown in FIG. 2.

FIGS. 5A and 5B illustrate modification examples of the voltage comparator circuit shown in FIG. 2. In the voltage comparator circuit illustrated in FIG. 5A, resistor R22 of the comparator circuit in FIG. 2 is omitted, resistor R21 is inserted between the collector of transistor Q21 and power source Vcc, and comparison voltage Vo is output from the collector of transistor Q21. In the voltage comparator circuit illustrated in FIG. 5B, resistor R21 is inserted between the collector of transistor Q21 and power source Vcc. Comparison voltage Vo can be output from the collector of transistor Q21 or Q22.

The voltage comparator circuits shown in FIGS. 5A and 5B perform the same operations as that of the voltage comparator circuit shown in FIG. 2.

Figure 6:
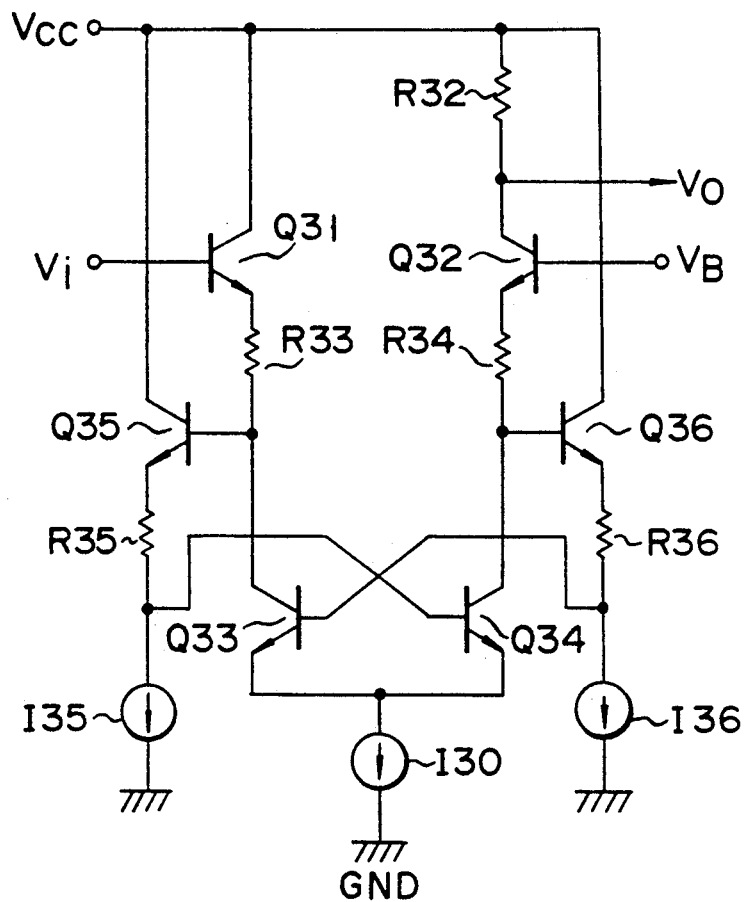
FIG. 6 is a circuit diagram showing a voltage comparator circuit according to a second embodiment of the present invention.

FIG. 6 shows a second embodiment of the voltage comparator circuit according to the present invention. In FIG. 6, Q31 and Q32 indicate NPN transistors for receiving a voltage. Comparison voltage Vi is applied to the base of transistor Q31, and reference voltage VB (threshold voltage) is applied to the base of transistor Q32.

The collector of transistor Q31 is connected to power source Vcc, and the collector of transistor Q32 is connected to power source Vcc through resistor R32. The emitter of transistor Q31 is connected to the base of NPN transistor and the emitter of NPN transistor Q33 connected to the base of NPN transistor Q36 and the emitter of NPN transistor Q34 through resistor R34.

The emitters of transistors Q33 and Q34 are connected to each other, and connected to ground GND through constant current source I30. The collector of transistor Q35 is connected to power source Vcc and the emitter thereof is connected in series to ground GND through resistor R35 and constant current source I35. A connecting point of resistor R35 and constant current source I35 is connected to the base of transistor Q34. The collector of transistor Q36 is connected to power source Vcc, and the emitter thereof is connected in series to ground GND through resistor R36 and constant current source I36. A connecting point of resistor R36 and constant current source I36 is connected to the base of transistor Q33. In the comparator circuit shown in FIG. 6, the currents of constant current sources I35 and I36 are equal to each other. Comparison voltage Vo is output from the collector of transistor Q32.

According to the arrangement of the voltage comparator circuit illustrated in FIG. 6, the same effect as that of the comparator circuit shown in FIG. 2 can be obtained. In addition, since the voltage application levels of the bases of transistors Q34 and Q33 are shifted by transistor Q35 and resistor R35 and transistor Q36 and resistor R36, transistors Q33 and Q34 are hard to enter a saturation region and thus an input dynamic range is broadened.

FIG. 7 illustrates a voltage comparator circuit according to the third embodiment of the present invention. This voltage comparator circuit comprises NPN transistors Q37 and Q38 which correspond to transistors Q31 and Q32, respectively, and are Darlington-connected, and NPN transistors Q39 and Q40, which correspond to transistors Q33 and Q34, respectively, and are Darlington-connected to, and therefore the comparator circuit does not include resistors R35 and R36 of the comparator circuit in FIG. 6. In FIG. 7, the descriptions of the elements denoted by the same numerals as those in FIG. 6 are omitted.

In the voltage comparator circuit shown in FIG. 7, the same effect as that of the comparator circuit shown in FIG. 6 can be obtained and, in addition, an input impedance is increased by the Darlington connection. Therefore, the voltage comparator circuit of FIG. 7 can be directly connected to an output terminal of a circuit of high impedance for sampling and holding a signal.

According to the arrangement of the comparator circuit illustrated in FIG. 7, the collectors of transistors Q39 and Q40 are connected to power source Vcc. As shown in FIG. 8, however, the collector of transistor Q39 can be connected to that of transistor Q33, and the collector of transistor Q40 can be connected to that of transistor Q34.

Figure 1:
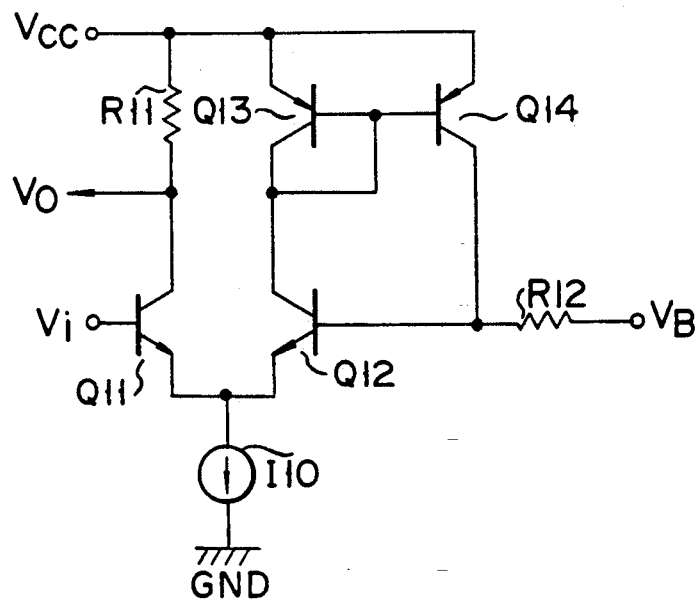
FIG. 1 is a circuit diagram showing a conventional voltage comparator circuit.

In the voltage comparator circuits shown in FIGS. 6 to 8, the positions from which comparison voltage Vo is output can be changed as shown in FIGS. 5A to 5B. The method of outputting voltage Vo is not limited to the above embodiments, and various applications are possible and a circuit shown in FIG. 9 can be used as one of the applications. The circuit of FIG. 9 can be applied to that of FIG. 1. In the circuit of FIG. 9, resistor R41 is connected between the collector of transistor Q22 and ground GND through PNP transistors Q41 and Q42 which constitute a current mirror circuit. Comparison voltage Vo is output from a connection node of the collector of transistor Q42 and resistor R41. Since a voltage is output between ground GND and high-level determined by resistance R41, the circuit of FIG. 9 is effective in forming a differential circuit of the PNP transistors as the posterior circuit.

Figure 11:
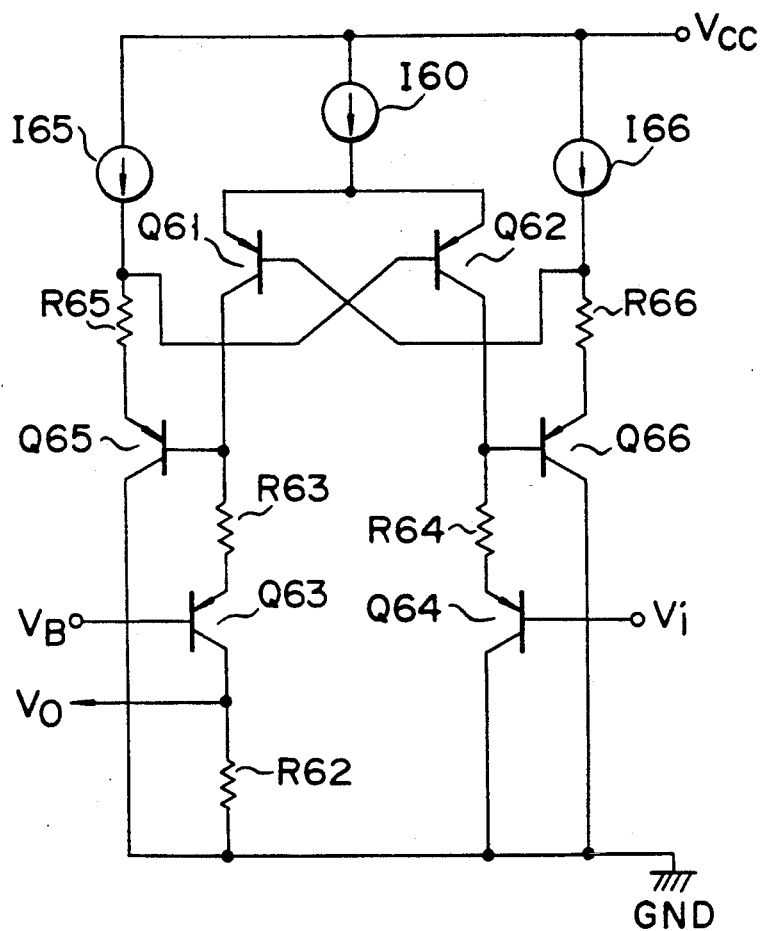
FIG. 11 is a circuit diagram showing an application example of the circuit arrangement shown in FIG. 6.
Figure 12:
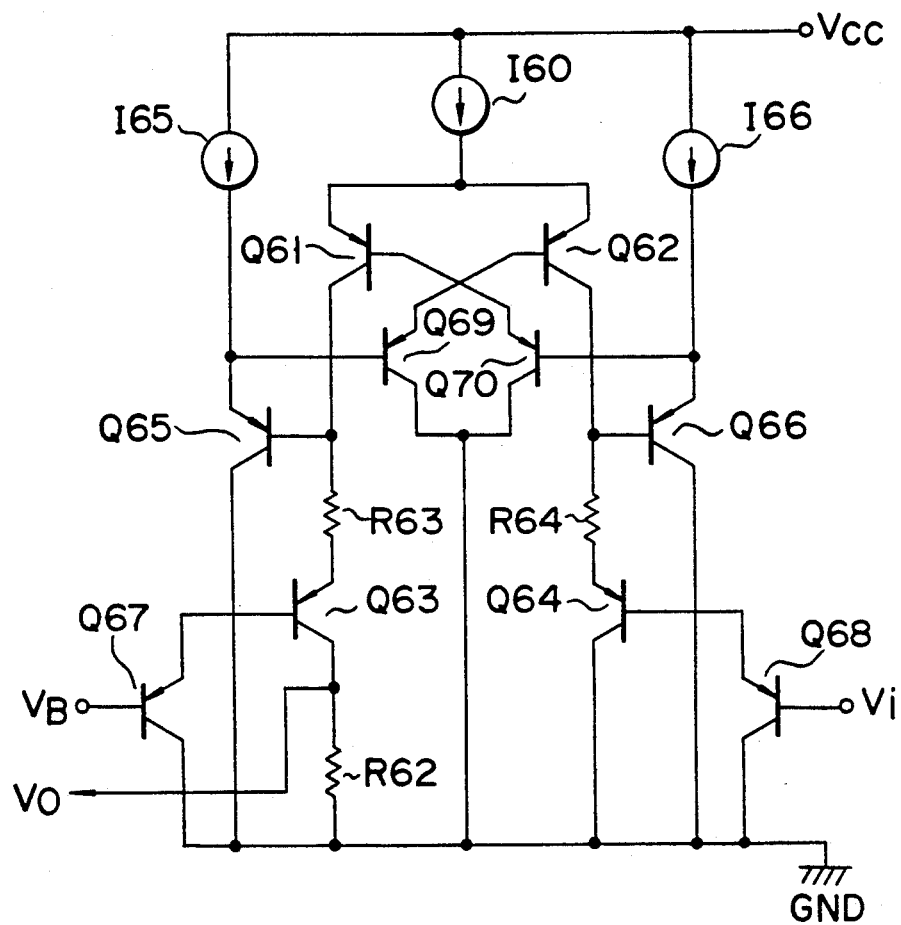
FIG. 12 is a circuit diagram showing an application example of the circuit arrangement shown in FIG. 7.

The NPN transistors are used in the embodiments shown in FIGS. 2, 5A, 5B, 6, 7, and 8. As shown in FIGS. 10 to 12, however, the circuit arrangement at the power source Vcc and ground GND sides can be reversed and a PNP transistor can be used. The circuits of FIGS. 10, 11, and 12 correspond to those of FIGS. 5B, 6 and 7.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A voltage comparator circuit having hysteresis characteristics of a narrow range of voltage, comprising:
    a first transistor to a base of which a comparison voltage is applied and a collector of which is connected to a first power source;
    a second transistor to a base of which a reference voltage is applied and a collector of which is connected to the first power source;
    a differential pair of third and fourth transistors whose emitters are connected to each other and whose bases and collectors are connected to each other, two lines connecting the bases and collectors of said third and fourth transistors crossing each other;
    a constant current source connected between a connecting point of the emitters of said third and fourth transistors and a second power source;
    a first resistor element connected between an emitter of said first transistor and a collector of said third transistor; and
    a second resistor element connected between an emitter of said second transistor and the collector of said fourth transistor.

2. A voltage comparator circuit according to claim 1, wherein currents flowing into the collectors of said first and second transistors are compared, and at least one of the collectors of said first and second transistors is provided with current/voltage conversion means.

3. A voltage comparator circuit according to claim 1, wherein said first power source is at a positive voltage, said second power source is at a ground voltage, said first to fourth transistors are NPN bipolar transistors, currents flowing into the collectors of said first and second transistors are compared, and at least one of the collectors of said first and second transistors is provided with current/voltage conversion means.

4. A voltage comparator circuit according to claim 1, wherein said first power source is at a ground voltage, said second power source is at a positive voltage, said first to fourth transistors are PNP bipolar transistors, currents flowing into the collectors of said first and second transistors are compared, and at least one of the collectors of said first and second transistors is provided with current/voltage conversion means.

5. A voltage comparator circuit having hysteresis characteristics of a narrow range of voltage, comprising:
    a first transistor to a base of which a comparison voltage is applied and a collector of which is connected to a first power source;
    a second transistor to a base of which a reference voltage is applied and a collector of which is connected to the first power source;
    a differential pair of third and fourth transistors whose emitters are connected to each other;
    a first constant current source connected between a connecting point of the emitters of said third and fourth transistors and a second power source;
    a first resistor element connected between an emitter of said first transistor and a collector of said third transistor;
    a second resistor element connected between an emitter of said second transistor and a collector of said fourth transistor;

a fifth transistor whose collector is connected to said first power source and whose base is connected to the collector of said third transistor;

a third resistor element and a second constant current source which are connected in series between an emitter of said fifth transistor and said second power source and whose connecting point is connected to a base of said fourth transistor;

a sixth transistor whose collector is connected to said first power source and whose base is connected to the collector of said fourth transistor; and a fourth resistor element and a third constant current source which are connected in series between an emitter of said sixth transistor and said second power source and whose connecting point is connected to a base of said third transistor.

6. A voltage comparator circuit according to claim 5, wherein currents flowing into the collectors of said first and second transistors are compared, and at least one of the collectors of said first and second transistors is provided with current/voltage conversion means.

7. A voltage comparator circuit according to claim 5, wherein said first power source is at a positive voltage, said second power source is at a ground voltage, said first to sixth transistors are NPN bipolar transistors, currents flowing into the collectors of said first and second transistors are compared, and at least one of the collectors of said first and second transistors is provided with current/voltage conversion means.

8. A voltage comparator circuit according to claim 5, wherein said first power source is at a ground voltage, said second power source is at a positive voltage, said first to sixth transistors are PNP bipolar transistors, currents flowing into the collectors of said first and second transistors are compared, and at least one of the collectors of said first and second transistors is provided with current/voltage conversion means.

9. A voltage comparator circuit having hysteresis characteristics of a narrow range of voltage, comprising:

a first transistor whose collector is connected to a first power source;

a second transistor whose collector is connected to the first power source;

a differential pair of third and fourth transistors whose emitters are connected to each other;

a first constant current source connected between a connecting point of the emitters of said third and fourth transistors and a second power source;

a first resistor element connected between an emitter of said first transistor and a collector of said third transistor;

a second resistor element connected between an emitter of said second transistor and a collector of said fourth transistor;

a fifth transistor whose collector is connected to said first power source and whose base is connected to the collector of said third transistor;

a second constant current source connected between an emitter of said fifth transistor and said second power source;

a sixth transistor whose collector is connected to said first power source and whose base is connected to the collector of said fourth transistor;

a third constant current source connected between an emitter of said sixth transistor and said second power source;

a seventh transistor to a base of which a comparison voltage is applied and which is Darlington-connected to said first transistor;

an eighth transistor to a base of which a reference voltage is applied and which is Darlington-connected to said second transistor;

a ninth transistor whose base is connected to a connecting point of said sixth transistor and said third constant current source and which is Darlington-connected to said third transistor; and a tenth transistor whose base is connected to a connecting point of said fifth transistor and said second constant current source and which is Darlington-connected to said fourth transistor.

10. A voltage comparator circuit according to claim 9, wherein currents flowing into the collectors of said first and second transistors are compared, and at least one of the collectors of said first and second transistors is provided with current/voltage conversion means.

11. A voltage comparator circuit according to claim 9, wherein said first power source is at a positive voltage, said second power source is at a ground voltage, said first to tenth transistors are NPN bipolar transistors, currents flowing into the collectors of said first and second transistors are compared, and at least one of the collectors of said first and second transistors is provided with current/voltage conversion means.

12. A voltage comparator circuit according to claim 9, wherein said first power source is at a ground voltage, said second power source is at a positive voltage, said first to tenth transistors are PNP bipolar transistors, currents flowing into the collectors of said first and second transistors are compared, and at least one of the collectors of said first and second transistors is provided with current/voltage conversion means.

13. A voltage comparator circuit according to claim 9, wherein said first power source is at a positive voltage, said second power source is at a ground voltage, said first to tenth transistors are NPN bipolar transistors, collectors of said ninth and tenth transistors are connected to said first power source, currents flowing into the collectors of said first and second transistors are compared, and at least one of the collectors of said first and second transistors is provided with current/voltage conversion means.

14. A voltage comparator circuit according to claim 9, wherein said first power source is at a ground voltage, said second power source is at a positive voltage, said first to tenth transistors are PNP bipolar transistors, collectors of said ninth and tenth transistors are connected to said first power source, currents flowing into the collectors of said first and second transistors are compared, and at least one of the collectors of said first and second transistors is provided with current/voltage conversion means.

15. A voltage comparator circuit according to claim 9, wherein said first power source is at a positive voltage, said second power source is at a ground voltage, said first to tenth transistors are NPN bipolar transistors, a collector of said ninth transistor is connected to a collector of said third transistor, and a collector of said tenth transistor is connected to the collector of said fourth transistor flowing into the collectors of said first and second transistors are compared, and at least one of the collectors of said first and second transistors is provided with current/voltage conversion means.

16. A voltage comparator circuit according to claim 9, wherein said first power source is at a ground voltage, said second power source is at a positive voltage, said first to tenth transistors are PNP bipolar transistors, a collector of said ninth transistor is connected to the collector of said third transistor, a collector of said tenth transistor is connected to the collector of said fourth transistor, currents flowing into the collectors of said first and second transistors are compared, and at least one of the collectors of said first and second transistors is provided with current/voltage conversion means.

* * * * *